US008679862B2

(12) United States Patent
Tachibana (10) Patent No.: US 8,679,862 B2
(45) Date of Patent: Mar. 25, 2014

(54) METHOD AND DEVICE FOR MANUFACTURING THIN FILM PHOTOELECTRIC CONVERSION MODULE

(75) Inventor: Shinsuke Tachibana, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 335 days.

(21) Appl. No.: 12/867,585

(22) PCT Filed: Jan. 28, 2009

(86) PCT No.: PCT/JP2009/051333
§ 371 (c)(1),
(2), (4) Date: Aug. 13, 2010

(87) PCT Pub. No.: WO2009/101857
PCT Pub. Date: Aug. 20, 2009

(65) Prior Publication Data
US 2010/0330732 A1 Dec. 30, 2010

(30) Foreign Application Priority Data

Feb. 13, 2008 (JP) ................................ 2008-031997

(51) Int. Cl.
*H01L 21/00* (2006.01)
*G01R 27/08* (2006.01)
*G01R 31/26* (2006.01)

(52) U.S. Cl.
USPC ................... 438/4; 438/12; 438/88; 324/718; 324/761.01

(58) Field of Classification Search
USPC ...................... 438/12, 4, 88; 324/718, 761.01
See application file for complete search history.

(56) References Cited

U.S. PATENT DOCUMENTS

| 4,166,918 | A | * | 9/1979 | Nostrand et al. | ............... | 136/243 |
| 4,640,002 | A | * | 2/1987 | Phillips et al. | ................... | 438/12 |
| 4,749,454 | A | * | 6/1988 | Arya et al. | ..................... | 205/656 |
| 4,806,496 | A | | 2/1989 | Suzuki et al. | | |
| 6,132,585 | A | * | 10/2000 | Midorikawa et al. | ......... | 205/123 |
| 6,228,662 | B1 | * | 5/2001 | Hayashi et al. | ................. | 438/12 |
| 6,365,825 | B1 | | 4/2002 | Hayashi et al. | | |
| 6,653,550 | B2 | * | 11/2003 | Hayashi et al. | ............... | 136/244 |
| 2003/0000565 | A1 | * | 1/2003 | Hayashi et al. | ............... | 136/244 |

(Continued)

FOREIGN PATENT DOCUMENTS

| EP | 1 052 704 | 11/2000 |
| EP | 1 612 862 | 1/2006 |

(Continued)

OTHER PUBLICATIONS

International Search Report for PCT/JP2009/051333 mailed, May 19, 2009.

(Continued)

*Primary Examiner* — Charles Garber
*Assistant Examiner* — Ron Pompey
(74) *Attorney, Agent, or Firm* — Nixon & Vanderhye, P.C.

(57) ABSTRACT

A method for manufacturing a thin film photoelectric conversion module includes the steps of forming a plurality of photoelectric conversion elements connected in series on a substrate, and carrying out reverse bias processing simultaneously on a group of photoelectric conversion elements including a plurality of the photoelectric conversion elements positioned with one or a plurality of the photoelectric conversion elements interposed between each of them, by applying a plurality of voltages electrically isolated from one another to the group of photoelectric conversion elements.

16 Claims, 4 Drawing Sheets

(56) References Cited

U.S. PATENT DOCUMENTS

| | | | |
|---|---|---|---|
| 2005/0284517 A1* | 12/2005 | Shinohara | 136/256 |
| 2008/0157718 A1* | 7/2008 | Ohnuki | 320/134 |
| 2009/0224142 A1 | 9/2009 | Nakano | |
| 2011/0250709 A1* | 10/2011 | Tachibana et al. | 438/17 |

FOREIGN PATENT DOCUMENTS

| | | |
|---|---|---|
| EP | 1 670 067 | 6/2006 |
| JP | 62-176172 | 8/1987 |
| JP | 62-176173 | 8/1987 |
| JP | 62-176174 | 8/1987 |
| JP | 10-004202 | 1/1998 |
| JP | 2000-323738 | 11/2000 |
| JP | 2001-237440 | 8/2001 |
| JP | 2003-037280 | 2/2003 |
| JP | 2006-013403 | 1/2006 |
| JP | 2008-091674 | 4/2008 |
| WO | 2008/041454 | 4/2008 |

OTHER PUBLICATIONS

International Search Report for PCT/JP2007/067725 mailed Dec. 11, 2007 (2 pages).

Office Action mailed Jun. 10, 2011 in related U.S. Appl. No. 12/442,596 (9 pages).

Takanori Nakano, U.S. Appl. No. 12/442,596, filed Mar. 24, 2009, entitled "Reverse Bias Processing Apparatus and Reverse Bias Processing Method for Photoelectric Conversion Devices".

* cited by examiner

METHOD AND DEVICE FOR MANUFACTURING THIN FILM PHOTOELECTRIC CONVERSION MODULE

This application is the U.S. national phase of International Application No. PCT/JP2009/051333, filed 28 Jan. 2009, which designated the U.S. and claims priority to Japanese Application No. 2008-031997, filed 13 Feb. 2008, the entire contents of each of which are hereby incorporated by reference.

TECHNICAL FIELD

The present invention, at least in part, relates to a method and a device for manufacturing a thin film photoelectric conversion module, and more particularly to a method and a device for manufacturing a thin film photoelectric conversion module in which a reverse bias voltage is applied to photoelectric conversion elements connected in series to carry out reverse bias processing.

BACKGROUND ART

In recent years, a thin film solar cell made from gas and formed with plasma CVD (Chemical Vapor Deposition) has been receiving attention. Examples of such thin film solar cell include a silicon-based thin film solar cell having a silicon-based thin film, a CIS compound thin film solar cell, and a CIGS compound thin film solar cell, which are being developed and expanded in production.

A thin film photoelectric conversion element forming such thin film solar cell is formed by stacking a semiconductor film and an electrode film on a substrate with plasma CVD, sputtering, vacuum vapor deposition or the like. In a thin film photoelectric conversion element, a semiconductor layer lying between two electrodes has a small thickness, so that a short-circuit is readily caused across the electrodes due to a pinhole in the semiconductor layer, resulting in lower power generation property.

In order to restore the property of such thin film solar cell, Japanese Patent Laying-Open No. 2000-323738 describes an invention of a reverse bias processing device for a solar cell module in which a reverse bias voltage is applied across electrodes of a solar battery cell to remove a short-circuit portion (pinhole).

The reverse bias processing device for a solar cell module described in Japanese Patent Laying-Open No. 2000-323738 characteristically includes probes of a plurality of stages which contact electrodes of solar battery cells of three or more stages adjacent to one another, raising and lowering means for raising and lowering the probes of the plurality of stages together, and a switch for selecting a pair of probes for applying a reverse bias voltage across electrodes of an arbitrary pair of the solar battery cells adjacent to each other from among the probes of the plurality of stages. After the probes are lowered to contact the electrodes of the solar battery cells, reverse bias processing on the solar battery cells of the plurality of stages can be carried out by switching the switch. As a result, the number of probe lowering operations that are the most time-consuming can be substantially reduced as compared to in the past, thereby improving overall efficiency of reverse bias processing.

Figure 7:
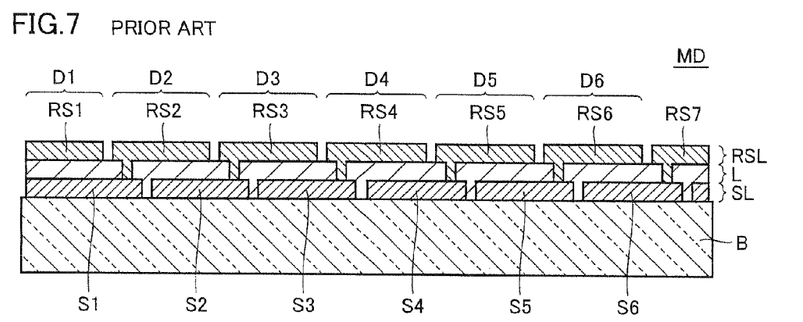
FIG. 7 is a schematic cross-sectional view of a conventional thin film photoelectric conversion module.
Figure 8:
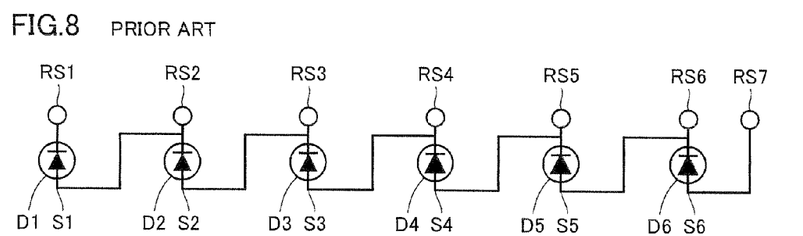
FIG. 8 is an equivalent circuit diagram of the conventional thin film photoelectric conversion module.

FIGS. 7 and 8 are diagrams illustrating a conventional reverse bias processing device for photoelectric conversion elements. FIG. 7 is a schematic cross-sectional view of a conventional thin film photoelectric conversion module. FIG. 8 is an equivalent circuit diagram of the conventional thin film photoelectric conversion module.

As shown in FIG. 7, in a thin film photoelectric conversion module MD, photoelectric conversion elements D1 to D6 have a structure in which a surface electrode layer SL including a transparent conductive film made of SnO2 or the like, a semiconductor layer L including a photoelectric conversion layer, and a rear surface electrode layer RSL including metal and a transparent electrode are stacked on a transparent insulating substrate B made of glass or the like.

Surface electrode layer SL, semiconductor layer L, and rear surface electrode layer RSL are partially removed, to electrically connect surface electrodes S1, S2, S3, S4, S5, and S6 to rear surface electrodes RS2, RS3, RS4, RS5, RS6, and RS7, respectively. Photoelectric conversion elements D1 to D6 are thus connected in series.

The equivalent circuit in FIG. 8 shows photoelectric conversion elements D1 to D6, surface electrodes S1 to S6, and rear surface electrodes S1 to S7. In the device described in Japanese Patent Laying-Open No. 2000-323738, a reverse bias voltage is applied across rear surfaces electrode RS1 and rear surface electrode RS2, i.e., to photoelectric conversion element D1, to carry out reverse bias processing, then a reverse bias voltage is applied by the switch across rear surface electrode RS2 and rear surface electrode RS3, i.e., to photoelectric conversion element D2, to carry out reverse bias processing, and then reverse bias processing is successively carried out through photoelectric conversion element D6.

Japanese Patent Laying-Open No. 62-176173 discloses a configuration for carrying out reverse bias processing simultaneously on all of a plurality of photoelectric conversion elements connected in series Patent Document 1: Japanese Patent Laying-Open No. 2000-323738

Patent Document 2: Japanese Patent Laying-Open No. 62-176173

DISCLOSURE OF THE INVENTION

Problems to be Solved by the Invention

The device described in Japanese Patent Laying-Open No. 2000-323738, however, requires time in accordance with the number of photoelectric conversion elements in order to carry out reverse bias processing on all the photoelectric conversion elements. The configuration described in Japanese Patent Laying-Open No. 62-176173 requires a power supply for each of the photoelectric conversion elements, resulting in a complicated configuration of a device for manufacturing a thin film photoelectric conversion module.

An object of the present invention is to provide a method and a device for manufacturing a thin film photoelectric conversion module in which reverse bias processing on a plurality of photoelectric conversion elements connected in series can be carried out with a simple configuration in a short time.

Means for Solving the Problems

A method for manufacturing a thin film photoelectric conversion module according to an aspect of the present invention includes the steps of forming a plurality of photoelectric conversion elements connected in series on a substrate, and carrying out reverse bias processing simultaneously on a group of photoelectric conversion elements including a plurality of the photoelectric conversion elements positioned with one or a plurality of the photoelectric conversion elements interposed between each of them, by applying a plurality of voltages electrically isolated from one another to the group of photoelectric conversion elements.

Preferably, the step of carrying out reverse bias processing includes the steps of applying the plurality of voltages to one or a plurality of the photoelectric conversion elements located in an even-numbered position(s) counted from one end of the series connection among the plurality of photoelectric conversion elements connected in series, and applying the plurality of voltages to one or a plurality of the photoelectric conversion elements located in an odd-numbered position(s) counted from the one end among the plurality of photoelectric conversion elements connected in series.

Preferably, each of the plurality of voltages is not more than a withstand voltage of the photoelectric conversion elements.

In order to solve the above-described problems, a device for manufacturing a thin film photoelectric conversion module including a plurality of photoelectric conversion elements connected in series on a substrate according to an aspect of the present invention includes a power supply configured to be able to generate a plurality of voltages electrically isolated from one another, and a voltage supply unit configured to be able to carry out reverse bias processing simultaneously on a group of photoelectric conversion elements including a plurality of the photoelectric conversion elements positioned with one or a plurality of the photoelectric conversion element(s) interposed between each of them, by applying the plurality of voltages to the group of photoelectric conversion elements.

Preferably, the voltage supply unit is configured to be able to simultaneously apply the plurality of voltages to one or a plurality of the photoelectric conversion elements located in an even-numbered position(s) counted from one end of the series connection among the plurality of photoelectric conversion elements connected in series, and to simultaneously apply the plurality of voltages to one or a plurality of the photoelectric conversion elements located in an odd-numbered position(s) counted from the one end among the plurality of photoelectric conversion elements connected in series.

Preferably, each of the plurality of voltages is not more than a withstand voltage of the photoelectric conversion elements.

Preferably, the power supply includes a plurality of terminals for outputting the plurality of voltages, respectively, and the voltage supply unit includes an electrode connection unit for electrically connecting the plurality of terminals to the plurality of photoelectric conversion elements connected in series.

More preferably, the voltage supply unit further includes a switching unit configured to be able to switch electrical connection and disconnection between the plurality of terminals and the plurality of photoelectric conversion elements connected in series.

Effects of the Invention

According to one or more aspects of the present invention, reverse bias processing on a plurality of photoelectric conversion elements connected in series can be carried out with a simple configuration in a short time.

DESCRIPTION OF THE REFERENCE SIGNS

1 voltage generation unit; 2, 52 voltage supply unit; 6 first isolation trench; 7 contact line; 8 second isolation trench; CA1, CA2, CB1, CB2, CC1, CC2, CSP electrode connection unit; TA1, TA2, TB1, TB2, TC1, TC2 terminal; PSA, PSB, PSC power supply; MD thin film photoelectric conversion module; 11 switching unit; 14 terminal; 101, 102 device for manufacturing thin film photoelectric conversion module; RS1 to RS7 rear surface electrode; D1 to D6 photoelectric conversion element; B transparent insulating substrate; S1 to S6 surface electrode; L semiconductor layer; SL surface electrode layer; RSL rear surface electrode layer.

BEST MODES FOR CARRYING OUT THE INVENTION

An embodiment of the present invention will be described hereinafter with reference to the drawings. It is noted that the same or corresponding parts have the same reference characters allotted in the drawings, and description thereof will not be repeated.

First Embodiment

Method for Manufacturing Thin Film Photoelectric Conversion Module

FIGS. 1(a) to (f) are schematic cross-sectional views showing an example of a method for manufacturing a thin film photoelectric conversion module according to an embodiment of the present invention.

Figure 1:
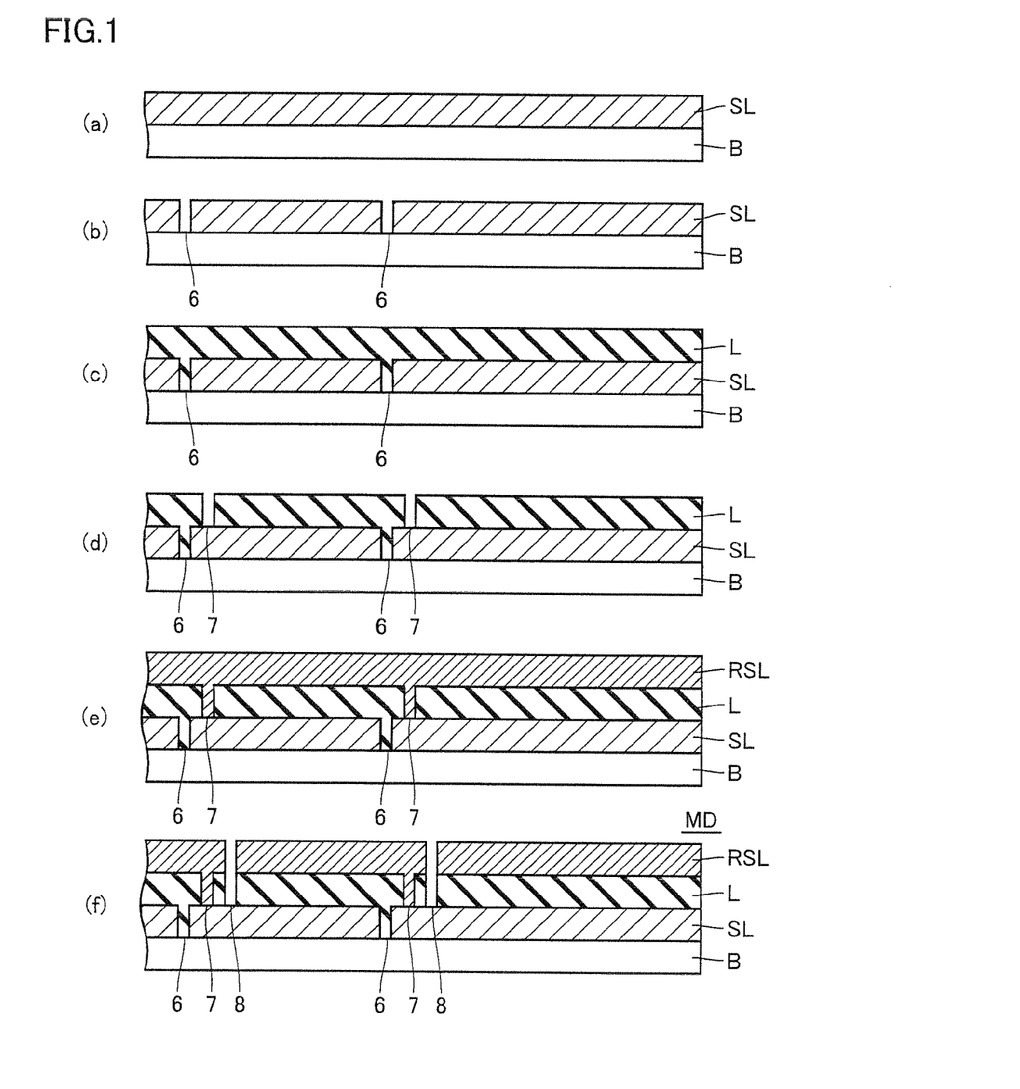
FIGS. 1(a) to (f) are schematic cross-sectional views showing an example of a method for manufacturing a thin film photoelectric conversion module according to an embodiment of the present invention.

First, as shown in FIG. 1(a), a surface electrode layer SL is formed on a transparent insulating substrate B. A glass substrate may be used, for example, as transparent insulating substrate B. A layer made of SnO2 (tin oxide), ITO (Indium Tin Oxide), ZnO (zinc oxide) or the like may be used, for example, as surface electrode layer SL. A method for forming surface electrode layer SL is not particularly limited, and conventionally known sputtering, vapor deposition, or ion plating may be used, for example.

Next, as shown in FIG. 1(b), a first isolation trench 6 is formed by partially removing surface electrode layer SL with laser scribing, for example, to partition surface electrode layer SL into a plurality of sections.

Next, as shown in FIG. 1(c), a semiconductor layer L is formed on a surface of surface electrode layer SL having been partitioned into a plurality of sections. Here, first isolation trench 6 is filled with semiconductor layer L. Semiconductor layer L may have a structure in which a p layer, an i layer and an n layer each including an amorphous silicon thin film are successively stacked, a structure in which a p layer, an i layer and an n layer each including a microcrystalline silicon thin film are successively stacked, a tandem structure having a combination of a structure in which a p layer, an layer and an n layer each including an amorphous silicon thin film are successively stacked and a structure in which a p layer, an i layer and an n layer each including a microcrystalline silicon thin film are successively stacked, or a structure having an intermediate layer made of ZnO or the like interposed between a structure in which a p layer, an i layer and an n layer each including an amorphous silicon thin film are successively stacked and a structure in which a p layer, an i layer and an n layer each including a microcrystalline silicon thin film are successively stacked, for example. Alternatively, like a structure having a combination of a p layer and an i layer each including an amorphous silicon thin film and an n layer including a microcrystalline silicon thin film, at least one of a p layer, an i layer, and an n layer may be formed from an amorphous silicon thin film, and the other layer(s) may be formed from a microcrystalline silicon thin film, so that a layer including an amorphous silicon thin film and a layer including a microcrystalline silicon thin may both be present in the p layer, the i layer and the n layer.

As the amorphous silicon thin film, a thin film made of a hydrogenated amorphous silicon-based semiconductor (a-Si: H) having a silicon dangling bond terminated with hydrogen may be used. As the microcrystalline silicon thin film, a thin film made of a hydrogenated microcrystalline silicon-based semiconductor (μc-Si:H) having a silicon dangling bond terminated with hydrogen may be used.

Semiconductor layer L may have a thickness of not less than 100 mm and not more than 600 nm, for example.

A method for forming semiconductor layer L used in the present invention is not particularly limited, and plasma CVD may be used, for example.

Next, as shown in FIG. 1(d), a contact line 7 is formed by partially removing semiconductor layer L with laser scribing, for example, to partition semiconductor layer L into a plurality of sections.

Next, as shown in FIG. 1(e), a rear surface electrode layer RSL is formed on a surface of semiconductor layer L. Here, contact line 7 is covered with rear surface electrode layer RSL. As rear surface electrode layer RSL, a stacked body including a metal thin film made of silver or aluminum and a transparent conductive film made of ZnO or the like may be used. The metal thin film may have a thickness of not less than 300 nm and not more than 1 μm, for example, and the transparent conductive film may have a thickness of not less than 50 nm and not more than 200 nm, for example.

As rear surface electrode layer RSL, only a single layer or a plurality of layers of the metal thin film may be used. It is preferable to use the transparent conductive film between the metal thin film including a single layer or a plurality of layers and semiconductor layer L because it prevents diffusion of metal atoms from the metal thin film into semiconductor layer L, and it tends to improve reflectivity of solar light due to the metal thin film. A method for forming rear surface electrode layer RSL is not particularly limited, and sputtering may be used, for example.

Next, as shown in FIG. 1(f), a second isolation trench 8 for partitioning semiconductor layer L and rear surface electrode layer RSL into a plurality of sections, respectively, is formed with laser scribing, for example.

[Configuration and Basic Operation]

Figure 2:
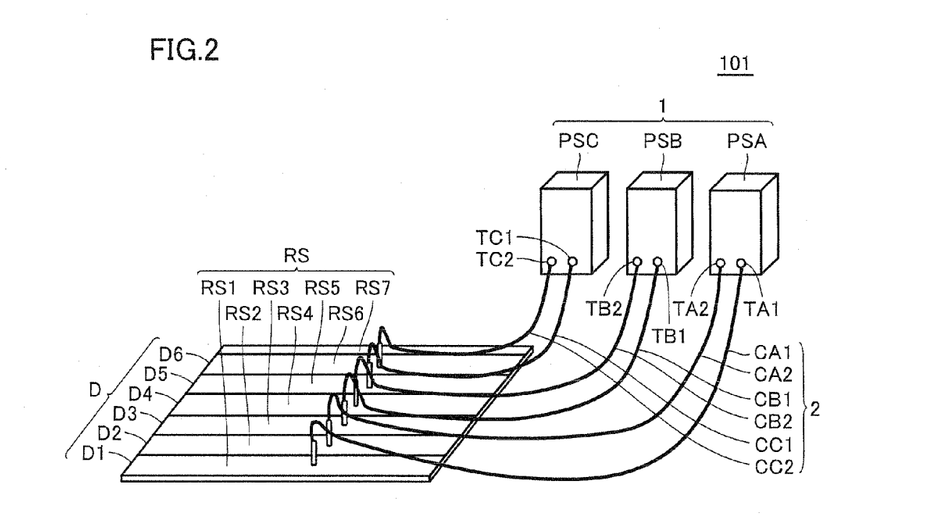
FIG. 2 is a schematic diagram of a device for manufacturing the thin film photoelectric conversion module according to a first embodiment of the present invention.

FIG. 2 is a schematic diagram of a device for manufacturing the thin film photoelectric conversion module according to the first embodiment of the present invention.

Referring to FIG. 2, a device 101 for manufacturing the thin film photoelectric conversion module includes a voltage generation unit 1, and a voltage supply unit 2. Voltage generation unit 1 includes power supplies PSA, PSB, and PSC electrically isolated from one another. Power supply PSA includes terminals TA1 and TA2. Power supply PSB includes terminals TB1 and TB2. Power supply PSC includes terminals TC1 and TC2. Voltage supply unit 2 includes electrode connection units CA1, CA2, CB1, CB2, CC1, and CC2.

Photoelectric conversion elements D1 to D6 have the same structure as that of photoelectric conversion elements D1 to D6 shown in FIG. 7 described above, for example.

Hereinafter, each of photoelectric conversion elements D1 to D6 may be referred to as a photoelectric conversion element D. Each of rear surface electrodes RS1 to RS7 may be referred to as a rear surface electrode RS, Each of surface electrodes S1 to S6 may be referred to as a surface electrode S. Each of electrode connection units CA1, CA2, CB1, CB2, CC1, and CC2 may be referred to as an electrode connection unit C.

Figure 3:
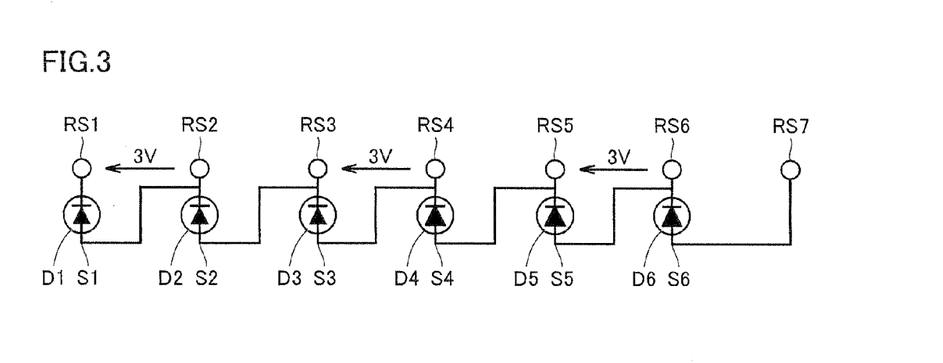
FIG. 3 is an equivalent circuit diagram of the thin film photoelectric conversion module according to the first embodiment of the present invention.

FIG. 3 is an equivalent circuit diagram of the thin film photoelectric conversion module according to the first embodiment of the present invention.

Referring to FIG. 3, each of photoelectric conversion elements D1 to D6 has rear surface electrode RS electrically connected to surface electrode S of adjacent photoelectric conversion element D. That is, surface electrode S of one of adjacent photoelectric conversion elements D is connected to rear surface electrode RS of the other photoelectric conversion element D successively. Photoelectric conversion elements D1 to D6 are thus connected in series.

[Operation]

An operation of applying a reverse bias to the photoelectric conversion elements by the device for manufacturing the thin film photoelectric conversion module according to the first embodiment of the present invention is now described.

First, as shown in FIG. 2, rear surface electrodes RS1, RS2, RS3, RS4, RS5, and RS6 are brought into contact with electrode connection units CA1, CA2, CB1, CB2, CC1, and CC2, respectively.

In this case, electrode connection unit CA1 electrically connects terminal TA1 to rear surface electrode RS1. Electrode connection unit CA2 electrically connects terminal TA2 to rear surface electrode RS2. Electrode connection unit CB1 electrically connects terminal TB1 to rear surface electrode RS3. Electrode connection unit CB2 electrically connects terminal TB2 to rear surface electrode RS4. Electrode connection unit CC1 electrically connects terminal TC1 to rear surface electrode RS5. Electrode connection unit CC2 electrically connects terminal TC2 to rear surface electrode RS6.

Then, power supplies PSA, PSB, and PSC output a DC voltage of 3V, for example, to a photoelectric conversion module MD. Power supplies PSA, PSB, and PSC may output voltages having values different from one another.

That is, as shown in FIG. 3, power supply PSA generates a DC voltage of 3V, for example, as a voltage V1, and applies voltage V1 across rear surface electrodes RS1 and RS2 from terminals TA1 and TA2 via electrode connection units CA1 and CA2, respectively, namely, applies a reverse bias voltage of 3V across rear surface electrode RS1 and surface electrode S1 of photoelectric conversion element D1.

Power supply PSB generates a DC voltage of 3V, for example, as a voltage V2, and applies voltage V2 across rear surface electrodes RS3 and RS4 from terminals TB1 and TB2 via electrode connection units CB1 and CB2, respectively, namely, applies a reverse bias voltage of 3V across rear surface electrode RS3 and surface electrode S3 of photoelectric conversion element D3.

Power supply PSC generates a DC voltage of 3V, for example, as a voltage V3, and applies voltage V3 across rear surface electrodes RS5 and RS6 from terminals TC1 and TC2 via electrode connection units CC1 and CC2, respectively, namely, applies a reverse bias voltage of 3V across rear surface electrode RS5 and surface electrode S5 of photoelectric conversion element D5.

With this structure, reverse bias processing can be carried out simultaneously on the plurality of photoelectric conversion elements D, thereby reducing time for reverse bias processing on the photoelectric conversion elements.

Since power supplies PSA, PSB, and PSC are electrically isolated from one another, rear surface electrodes RS2, RS4, and RS6 of photoelectric conversion elements D2, D4, and D6 have potentials independent from one another. Thus, a forward voltage is not applied to photoelectric conversion elements D2, D4, and D6.

Figure 4:
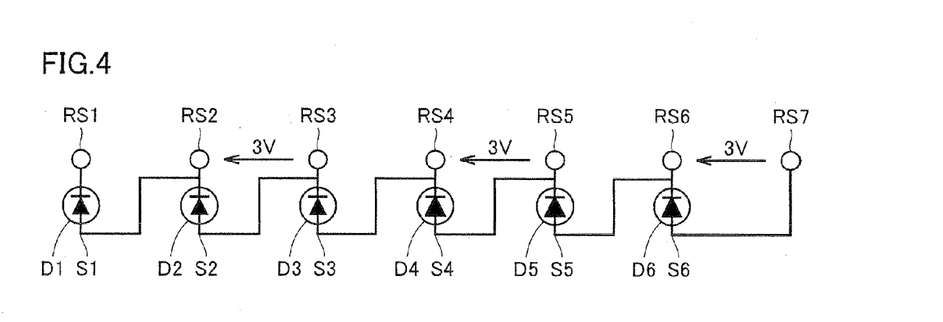
FIG. 4 is a circuit diagram showing an operation of applying a reverse bias to photoelectric conversion elements by the device for manufacturing the thin film photoelectric conversion module according to the first embodiment of the present invention.

FIG. 4 is a circuit diagram showing the operation of applying a reverse bias to the photoelectric conversion elements by the device for manufacturing the thin film photoelectric conversion module according to the first embodiment of the present invention.

Referring to FIG. 4, next, photoelectric conversion elements D adjacent to photoelectric conversion elements D to which the reverse bias voltage was applied are set as photoelectric conversion elements D to which the reverse bias voltage is to be newly applied. Then, voltage supply unit 2 applies a reverse bias voltage to newly set photoelectric conversion elements D.

More specifically, rear surface electrodes RS2, RS3, RS4, RS5, RS6, and RS7 are brought into contact with electrode connection units CA1, CA2, CB1, CB2, CC1, and CC2, respectively.

Then, power supplies PSA, PSB, and PSC output a DC voltage of 3V, for example, to photoelectric conversion module MD. Power supplies PSA, PSB, and PSC may output voltages having values different from one another.

That is, power supply PSA generates a DC voltage of 3V, for example, as voltage V1, and applies voltage V1 across rear surface electrodes RS2 and RS3 from terminals TA1 and TA2 via electrode connection units CA1 and CA2, respectively, namely, applies a reverse bias voltage of 3V across rear surface electrode RS2 and surface electrode S2 of photoelectric conversion element D2.

Power supply PSB generates a DC voltage of 3V, for example, as voltage V2, and applies voltage V2 across rear surface electrodes RS4 and RS5 from terminals TB1 and TB2 via electrode connection units CB1 and CB2, respectively, namely, applies a reverse bias voltage of 3V across rear surface electrode RS4 and surface electrode S4 of photoelectric conversion element D4.

Power supply PSC generates a DC voltage of 3V, for example, as voltage V3, and applies voltage V3 across rear surface electrodes RS6 and RS7 from terminals TC1 and TC2 via electrode connection units CC1 and CC2, respectively, namely, applies a reverse bias voltage of 3V across rear surface electrode RS6 and surface electrode S6 of photoelectric conversion element D6.

Since power supplies PSA, PSB, and PSC are electrically isolated from one another, rear surface electrodes RS1, RS3, and RS5 of photoelectric conversion elements D1, D3, and D5 have potentials independent from one another. Thus, a forward voltage is not applied to photoelectric conversion elements D1, D3, and D5.

As a result of these two steps, reverse bias processing can be carried out on all of photoelectric conversion elements D1 to D6.

The configuration of the device for manufacturing a thin film photoelectric conversion module described in Japanese Patent Laying-Open No. 62-176173 becomes complicated, as described above. In addition, since this configuration is intended to carry out reverse bias processing simultaneously on all photoelectric conversion elements, an accurate leak current value cannot be determined if an adjacent cell is leaking. A leak current value is a critical source of information in conducting failure analysis of a thin film photoelectric conversion module, and therefore needs to be accurately determined.

In order to solve these problems, a method of using a switch may be employed, as described in Japanese Patent Laying-Open No. 2000-323738. For example, a method for applying a reverse bias voltage to a plurality of photoelectric conversion elements to carry out simultaneous processing by using the device described in Japanese Patent Laying-Open No. 2000-323738 may be as described below.

Figure 5:
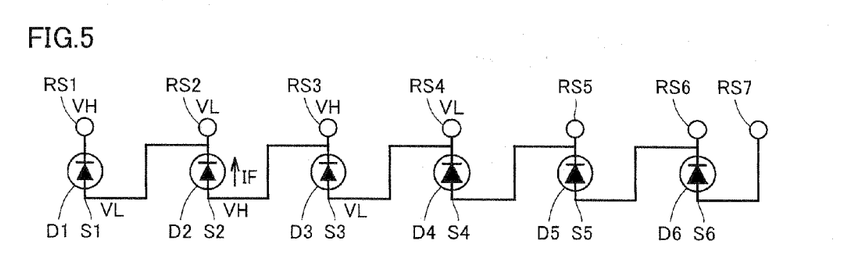
FIG. 5 is a circuit diagram showing a state where a reverse bias is applied to a plurality of photoelectric conversion elements in a reverse bias processing device for photoelectric conversion elements.

FIG. 5 is a circuit diagram showing a state where a reverse bias is applied to a plurality of photoelectric conversion elements in a reverse bias processing device for photoelectric conversion elements.

Referring to FIG. 5, the device described in Japanese Patent Laying-Open No. 2000-323738 is used to select a pair of photoelectric conversion elements D with one photoelectric conversion element D interposed therebetween, and carry out reverse bias processing simultaneously on the selected photoelectric conversion elements. For example, reverse bias processing is carried out simultaneously on photoelectric conversion element D1 and photoelectric conversion element D3. That is, a high potential VH is supplied to rear surface electrode RS1 and rear surface electrode RS3, and a low potential VS is supplied to rear surface electrode RS2 and rear surface electrode RS4.

As a result, a p side electrode of photoelectric conversion element D2 has high potential VH and an n side electrode has low potential VL, causing an excessive forward current IF to flow through photoelectric conversion element D2. This causes breakage of photoelectric conversion element D2, and a flow of an excessive current higher than a power capacity of a power supply for supplying a reverse bias voltage, resulting in inability to maintain a voltage applied to each photoelectric conversion element to a desired voltage.

In order to solve these problems, it is necessary to prepare a power supply for applying a small forward voltage to a photoelectric conversion element not subjected to reverse bias processing and to carry out reverse bias processing on one photoelectric conversion element and then on the next photoelectric conversion element, or to prepare a switching circuit for making a short-circuit across a surface electrode and a rear surface electrode of a photoelectric conversion element not subjected to reverse bias processing. Accordingly, time for reverse bias processing on the entire thin film photoelectric conversion module is increased, resulting in a complicated configuration of the reverse bias processing device.

In contrast, in the method and the device for manufacturing the thin film photoelectric conversion module according to the first embodiment of the present invention, a plurality of photoelectric conversion elements positioned with one or a plurality of photoelectric conversion element(s) interposed between each of them are set as photoelectric conversion elements to which a reverse bias voltage is to be applied. Then, a plurality of voltages electrically isolated from one another are applied across rear surface electrodes and surface electrodes of the set plurality of photoelectric conversion elements, respectively.

With this structure, reverse bias processing can be carried out simultaneously on the plurality of photoelectric conversion elements, thereby reducing time for reverse bias processing on the photoelectric conversion elements. Further, power supplies only equivalent to the number of photoelectric conversion elements simultaneously subjected to reverse bias processing need to be prepared without the need to prepare a power supply for each photoelectric conversion element. Therefore, reverse bias processing can be carried out simultaneously on the plurality of photoelectric conversion elements with less power supplies. Moreover, since the plurality of power supplies electrically isolated from one another apply reverse bias voltages to the photoelectric conversion elements to be subjected to reverse bias processing, respectively, a forward voltage is not applied to a photoelectric conversion element not to be subjected to reverse bias processing, thereby preventing a flow of an excessive forward current. In the method and the device for manufacturing the thin film photoelectric conversion module according to the first embodiment of the present invention, therefore, reverse bias processing on the plurality of photoelectric conversion elements connected in series can be carried out stably with a simple configuration in a short time. In addition, an accurate leak current value can be determined even if an adjacent cell is leaking.

While the reverse bias voltage is 3V in the method and the device for manufacturing the thin film photoelectric conversion module according to the first embodiment of the present invention, this is not restrictive. The reverse bias voltage should only be a voltage not more than a withstand voltage of photoelectric conversion element D in order to prevent breakage of a PIN junction in photoelectric conversion element D which causes a short-circuit. The withstand voltage of the photoelectric conversion element is generally about several to 20 V, although varying depending on a structure of the photoelectric conversion element, such as a thickness of and the number of semiconductor layers.

While the reverse voltage is applied to the plurality of photoelectric conversion elements positioned with one photoelectric conversion element interposed therebetween among the plurality of photoelectric conversion elements connected in series in the method and the device for manufacturing the thin film photoelectric conversion module according to the first embodiment of the present invention, this is not restrictive. The reverse bias voltage may be applied to a plurality of photoelectric conversion elements with a plurality of photoelectric conversion elements connected therebetween.

In this case, after reverse bias processing is carried out simultaneously on a plurality of photoelectric conversion elements, setting of a plurality of photoelectric conversion elements to which the reverse bias voltage is to be newly applied and application of a reverse bias voltage to the newly set plurality of photoelectric conversion elements are repeated. That is, as with the setting of and the reverse bias processing on photoelectric conversion elements D2, D4, and D6 described above, voltage supply unit 2 repeats an operation of setting photoelectric conversion elements D adjacent to photoelectric conversion elements D to which the reverse bias voltage was applied as photoelectric conversion elements D to which the reverse bias voltage is to be newly applied, and an operation of applying a reverse bias voltage to newly set photoelectric conversion elements D.

By performing these operations a plurality of times, reverse bias processing can be carried out on all of photoelectric conversion elements D.

While photoelectric conversion elements D adjacent to photoelectric conversion elements D to which the reverse bias voltage was applied are set as photoelectric conversion elements D to which the reverse bias voltage is to be newly applied in the method and the device for manufacturing the thin film photoelectric conversion module according to the first embodiment of the present invention, this is not restrictive. It is only required that photoelectric conversion elements D to which a reverse bias voltage has not been applied are set as photoelectric conversion elements D to which the reverse bias voltage is to be newly applied.

Power supplies PSA, PSB, and PSC only need to be electrically isolated from one another, so that potentials of the terminals of power supplies PSA, PSB, and PSC are independent from one another and not relative to one another.

While electrode connection unit C is brought into contact with rear surface electrode RS in the method and the device for manufacturing the thin film photoelectric conversion module according to the first embodiment of the present invention, electrode connection unit C may be brought into contact with surface electrode R if surface electrode R is exposed. That is, electrode connection unit C may be brought into contact with either rear surface electrode RS or surface electrode R.

While a super-straight type photoelectric conversion element including a transparent substrate is described by way of example in the method and the device for manufacturing the thin film photoelectric conversion module according to the first embodiment of the present invention, a sub-straight type photoelectric conversion element including a non-transparent substrate may be used.

While reverse bias processing is carried out simultaneously on three photoelectric conversion elements by using three power supplies in parallel in the method and the device for manufacturing the thin film photoelectric conversion module according to the first embodiment of the present invention, this is not restrictive. If thin film photoelectric conversion module MD includes a large number of photoelectric conversion elements connected in series, the number of power supplies may be increased to reduce time for reverse bias processing.

In the present and the following embodiments, "reverse bias processing is carried out simultaneously" includes not only the case where reverse bias processing on a plurality of photoelectric conversion elements is simultaneously started and completed, but also cases where reverse bias processing is started at different points in time and completed at different points in time. That is, it is only required that reverse bias processing on a plurality of photoelectric conversion elements is carried out by application of a reverse bias voltage to the plurality of photoelectric conversion elements at a certain point in time.

Another embodiment of the present invention is now described with reference to the drawings. It is noted that the same or corresponding parts have the same reference characters allotted in the drawings, and description thereof will not be repeated.

Second Embodiment

The present embodiment is directed to the method and the device for manufacturing the thin film photoelectric conversion module according to the first embodiment, which further includes the function of switching a connection relation between the power supplies and the photoelectric conversion elements. Except the contents described below, the present embodiment is the same as the method and the device for manufacturing the thin film photoelectric conversion module according to the first embodiment.

Figure 6:
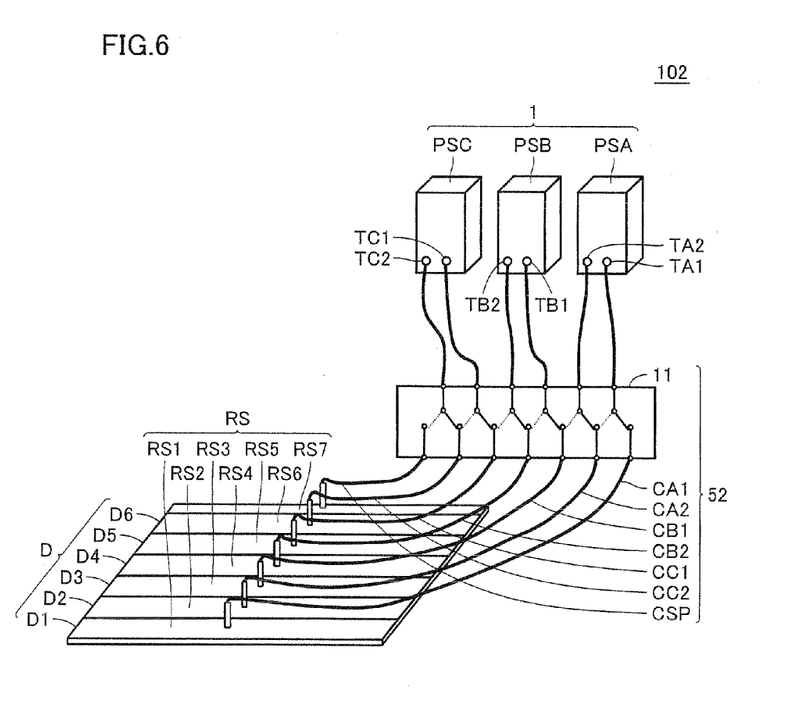
FIG. 6 is a schematic diagram of a device for manufacturing a thin film photoelectric conversion module according to a second embodiment of the present invention.

FIG. 6 is a schematic diagram of a device for manufacturing a thin film photoelectric conversion module according to the second embodiment of the present invention.

Referring to FIG. 6, a device 102 for manufacturing a thin film photoelectric conversion module includes a voltage supply unit 52 instead of voltage supply unit 2, as compared to the device for manufacturing the thin film photoelectric conversion module according to the first embodiment of the present invention. Voltage supply unit 52 includes a switching unit 11, and electrode connection units CA1, CA2, CB1, CB2, CC1, CC2, and CSP.

Hereinafter, each of electrode connection units CA1, CA2, CB1, CB2, CC1, CC2, and CSP may be referred to as electrode connection unit C.

Electrode connection unit CA1 is connected to rear surface electrode RS1. Electrode connection unit CA2 is connected to rear surface electrode RS2. Electrode connection unit CB1 is connected to rear surface electrode RS3. Electrode connection unit CB2 is connected to rear surface electrode RS4. Electrode connection unit CC1 is connected to rear surface electrode RS5. Electrode connection unit CC2 is connected to rear surface electrode RS6. Electrode connection unit CSP is connected to rear surface electrode RS7.

Switching unit 11 is connected between power supplies PS and electrode connection units C, and includes a plurality of switches. Switching unit 11 switches electrical connection and disconnection between terminals TA1, TA2, TB1, TB2, TC1, TC2 of power supplies PSA, PSB, PSC and rear surface electrodes RS1 to RS7, respectively.

In order to carry out reverse bias processing simultaneously on the plurality of photoelectric conversion elements D, at least two power supplies PS electrically isolated from each other are required. Each of power supplies PS includes two terminals for outputting a voltage. That is, in order to switch connection relation between the four terminals of the two power supplies and photoelectric conversion elements D, at least five electrode connection units C are required.

[Operation]

An operation of applying a reverse bias to the photoelectric conversion elements by the device for manufacturing the thin film photoelectric conversion module according to the second embodiment of the present invention is now described.

First, as shown with solid lines in FIG. 6, switching unit 11 electrically connects terminals TA1, TA2, TB1, TB2, TC1, and TC2 to rear surface electrodes RS1, RS2, RS3, RS4, RS5, and RS6, respectively.

Then, power supplies PSA, PSB, and PSC output a DC voltage of 3V, for example, to photoelectric conversion module MD.

That is, power supply PSA generates a DC voltage of 3V, for example, as voltage V1, and applies voltage V1 across rear surface electrodes RS1 and RS2 from terminals TA1 and TA2 via electrode connection units CA1 and CA2, respectively, namely, applies a reverse bias voltage of 3V across rear surface electrode RS1 and surface electrode S1 of photoelectric conversion element D1.

Power supply PSB generates a DC voltage of 3V, for example, as voltage V2, and applies voltage V2 across rear surface electrodes RS3 and RS4 from terminals TB1 and TB2 via electrode connection units CB1 and CB2, respectively, namely, applies a reverse bias voltage of 3V across rear surface electrode RS3 and surface electrode S3 of photoelectric conversion element D3.

Power supply PSC generates a DC voltage of 3V, for example, as voltage V3, and applies voltage V3 across rear surface electrodes RS5 and RS6 from terminals TC1 and TC2 via electrode connection units CC1 and CC2, respectively, namely, applies a reverse bias voltage of 3V across rear surface electrode RS5 and surface electrode S5 of photoelectric conversion element D5.

With this structure, reverse bias processing can be carried out simultaneously on the plurality of photoelectric conversion elements D, thereby reducing time for reverse bias processing on the photoelectric conversion elements.

Since power supplies PSA, PSB, and PSC are electrically isolated from one another, rear surface electrodes RS2, RS4, and RS6 of photoelectric conversion elements D2, D4, and D6 have potentials independent from one another. Thus, a forward voltage is not applied to photoelectric conversion elements D2, D4, and D6.

Next, photoelectric conversion elements D adjacent to photoelectric conversion elements D to which the reverse bias voltage was applied are set as photoelectric conversion elements D to which the reverse bias voltage is to be newly applied. Then, voltage supply unit 52 applies a reverse bias voltage to newly set photoelectric conversion elements D.

More specifically, switching unit 11 electrically connects terminals TA1, TA2, TB1, TB2, TC1, and TC2 to rear surface electrodes RS2, RS3, RS4, RS5, RS6, and RS7, respectively.

Then, as shown with dashed lines in FIG. 6, power supplies PSA, PSB, and PSC output a DC voltage of 3V, for example, to photoelectric conversion module MD.

That is, power supply PSA generates a DC voltage of 3V, for example, as voltage V1, and applies voltage V1 across rear surface electrodes RS2 and RS3 from terminals TA1 and TA2 via electrode connection units CA1 and CA2, respectively, namely, applies a reverse bias voltage of 3V across rear surface electrode RS2 and surface electrode S2 of photoelectric conversion element D2.

Power supply PSB generates a DC voltage of 3V, for example, as voltage V2, and applies voltage V2 across rear surface electrodes RS4 and RS5 from terminals TB1 and TB2 via electrode connection units CB1 and CB2, respectively, namely, applies a reverse bias voltage of 3V across rear surface electrode RS4 and surface electrode S4 of photoelectric conversion element D4.

Power supply PSC generates a DC voltage of 3V, for example, as voltage V3, and applies voltage V3 across rear surface electrodes RS6 and RS7 from terminals TC1 and TC2 via electrode connection units CC1 and CC2, respectively, namely, applies a reverse bias voltage of 3V across rear surface electrode RS6 and surface electrode S6 of photoelectric conversion element D6.

Since power supplies PSA, PSB, and PSC are electrically isolated from one another, rear surface electrodes RS1, RS3, and RS5 of photoelectric conversion elements D1, D3, and D5 have potentials independent from one another. Thus, a forward voltage is not applied to photoelectric conversion elements D1, D3, and D5.

As a result of these two steps, reverse bias processing can be carried out on all of photoelectric conversion elements D1 to D6.

The configuration and operation are otherwise the same as those of the method and the device for manufacturing the thin film photoelectric conversion module according to the first embodiment, and thus detailed description thereof will not be repeated. In the method and the device for manufacturing the thin film photoelectric conversion module according to the second embodiment of the present invention, therefore, reverse bias processing on the plurality of photoelectric conversion elements connected in series can be carried out stably with a simple configuration in a short time.

Further, in the method and the device for manufacturing the thin film photoelectric conversion module according to the second embodiment of the present invention, switching unit 11 is used so that positions of electrode connection units C or of thin film photoelectric conversion elements D do not need to be shifted when selecting thin film photoelectric conversion elements D to be subjected to reverse bias processing. Therefore, time for reverse bias processing can be reduced and the device can be simplified as compared to the method and the device for manufacturing the thin film photoelectric conversion module according to the first embodiment of the present invention.

While the two steps are performed as reverse bias processing steps in the method and the device for manufacturing the thin film photoelectric conversion module according to the second embodiment of the present invention, it is desirable in terms of reducing time for manufacturing thin film photoelectric conversion module MD to perform the first step, and then perform the second step by shifting thin film photoelectric conversion module MID and using another power supply.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

The invention claimed is:

1. A method for manufacturing a thin film photoelectric conversion module, comprising the steps of:
    forming a plurality of photoelectric conversion elements connected in series on a substrate; and
    carrying out reverse bias processing simultaneously on a group of photoelectric conversion elements including a plurality of said photoelectric conversion elements positioned with one or a plurality of said photoelectric conversion elements not in the group interposed between each photoelectric conversion element of the group, by applying a plurality of voltages having potentials independent from one another to said group of photoelectric conversion elements.

2. The method for manufacturing a thin film photoelectric conversion module according to claim 1, wherein
    said step of carrying out reverse bias processing includes the steps of
    applying said plurality of voltages to one or a plurality of said photoelectric conversion elements located in an even-numbered position(s) counted from one end of the series connection among said plurality of photoelectric conversion elements connected in series, and
    applying said plurality of voltages to one or a plurality of said photoelectric conversion elements located in an odd-numbered position(s) counted from said one end among said plurality of photoelectric conversion elements connected in series.

3. The method for manufacturing a thin film photoelectric conversion module according to claim 1, wherein
    each of said plurality of voltages is not more than a withstand voltage of said photoelectric conversion elements.

4. A device for manufacturing a thin film photoelectric conversion module including a plurality of photoelectric conversion elements connected in series on a substrate, comprising:
    a power supply configured to be able to generate a plurality of voltages having potentials independent from one another; and
    a voltage supply unit configured to be able to carry out reverse bias processing simultaneously on a group of photoelectric conversion elements including a plurality of said photoelectric conversion elements positioned with one or a plurality of said photoelectric conversion elements not in the group interposed between each photoelectric conversion element of the group, by applying a plurality of voltages having potentials independent from one another to said group of photoelectric conversion elements.

5. The device for manufacturing a thin film photoelectric conversion module according to claim 4, wherein
    said voltage supply unit is configured to be able to simultaneously apply said plurality of voltages to one or a plurality of said photoelectric conversion elements located in an even-numbered position(s) counted from one end of the series connection among said plurality of photoelectric conversion elements connected in series, and to simultaneously apply said plurality of voltages to one or a plurality of said photoelectric conversion elements located in an odd-numbered position(s) counted from said one end among said plurality of photoelectric conversion elements connected in series.

6. The device for manufacturing a thin film photoelectric conversion module according to claim 4, wherein
    each of said plurality of voltages is not more than a withstand voltage of said photoelectric conversion elements.

7. The device for manufacturing a thin film photoelectric conversion module according to claim 4, wherein
    said power supply includes a plurality of terminals for outputting said plurality of voltages, respectively, and
    said voltage supply unit includes an electrode connection unit for electrically connecting said plurality of terminals to said plurality of photoelectric conversion elements connected in series.

8. The device for manufacturing a thin film photoelectric conversion module according to claim 7, wherein
    said voltage supply unit further includes a switching unit configured to be able to switch electrical connection and disconnection between said plurality of terminals and said plurality of photoelectric conversion elements connected in series.

9. The method for manufacturing a thin film photoelectric conversion module according to claim 1, wherein no voltage is applied to the photoelectric conversion elements not in the group while the reverse bias processing is being carried out on the group of photoelectric conversion elements.

10. The device for manufacturing a thin film photoelectric conversion module according to claim 4, wherein the voltage supply unit is configured to apply no voltage to the photoelectric conversion elements not in the group while carrying out the reverse bias processing on the group of photoelectric conversion elements.

11. A method for manufacturing a thin film photoelectric conversion module, the method comprising:
    forming a plurality of photoelectric conversion elements connected in series on a substrate, wherein the plurality of photoelectric conversion elements includes at least first, second and third photoelectric conversion elements such that the third photoelectric conversion element is interposed between the first and second photoelectric conversion elements; and simultaneously applying a first reverse bias voltage across the first photoelectric conversion element and a second reverse bias voltage across the second photoelectric conversion element, wherein the first and second reverse bias voltages are generated from first and second power supplies that have potentials independent from each other, and wherein no voltage is applied across the third photoelectric conversion element while the first and second reverse bias voltages are being applied across the first and second photoelectric conversion elements.

12. The method of claim 11, wherein the plurality of photoelectric conversion elements further includes at least a fourth photoelectric conversion element such that the second photoelectric conversion element is interposed between the third and fourth photoelectric conversion elements, wherein the method further comprises simultaneously applying the first reverse bias voltage across the third photoelectric conversion element and the second reverse bias voltage across the fourth photoelectric conversion element, and wherein no voltage is applied across the second photoelectric conversion element while the first and second reverse bias voltages are being applied across the third and fourth photoelectric conversion elements.

13. The method of claim 11, wherein the third photoelectric conversion element is immediately adjacent to one or both of the first and second photoelectric conversion elements.

14. A device configured to manufacture a thin film photoelectric conversion module including a plurality of photoelectric conversion elements connected in series on a substrate, the plurality of photoelectric conversion elements including at least first, second and third photoelectric conversion elements such that the third photoelectric conversion element is interposed between the first and second photoelectric conversion elements, the device comprising:

a voltage generation unit comprising at least first and second power supplies that have potentials independent from each other, the first and second power supplies configured to output first and second reverse bias voltages respectively; and a voltage supply unit configured to simultaneously apply the first reverse bias voltage across the first photoelectric conversion element and the second reverse bias voltage across the second photoelectric conversion element, and apply no voltage across the third photoelectric conversion element while applying the first and second reverse bias voltages across the first and second photoelectric conversion elements.

15. The device of claim 14, wherein the plurality of photoelectric conversion elements further includes at least a fourth photoelectric conversion element such that the second photoelectric conversion element is interposed between the third and fourth photoelectric conversion elements, and wherein the voltage supply unit is configured to simultaneously apply the first reverse bias voltage across the third photoelectric conversion element and the second reverse bias voltage across the fourth photoelectric conversion element, and apply no voltage across the second photoelectric conversion element while applying the first and second reverse bias voltages across the third and fourth photoelectric conversion elements.

16. The device of claim 14, wherein the third photoelectric conversion element is immediately adjacent to one or both of the first and second photoelectric conversion elements.

* * * * *